United States Patent
Shi et al.

(10) Patent No.: US 7,989,696 B2
(45) Date of Patent: Aug. 2, 2011

(54) HOUSING ASSEMBLY FOR ELECTRONIC DEVICE

(75) Inventors: Zheng Shi, Shenzhen (CN);
Chih-Chiang Chang, Taipei Hsien (TW); Zhi Li, Shenzhen (CN);
Xiang-Guo Zhao, Shenzhen (CN)

(73) Assignees: Shenzhen Futaihong Precision Industry Co., Ltd., ShenZhen, Guangdong Province (CN); FIH (Hong Kong) Limited, Kowloon (HK)

( * ) Notice: Subject to any disclaimer, the term of this patent is extended or adjusted under 35 U.S.C. 154(b) by 646 days.

(21) Appl. No.: 12/141,230

(22) Filed: Jun. 18, 2008

(65) Prior Publication Data
US 2009/0237892 A1    Sep. 24, 2009

(30) Foreign Application Priority Data
Mar. 20, 2008    (CN) .......................... 2008 1 0300646

(51) Int. Cl.
*H02G 3/14*    (2006.01)

(52) U.S. Cl. .............................. 174/50; 174/135; 361/728
(58) Field of Classification Search .................... 174/50; 361/728, 679.01; 439/326
See application file for complete search history.

(56) References Cited

U.S. PATENT DOCUMENTS

| | | | | |
|---|---|---|---|---|
| 5,955,700 | A * | 9/1999 | Slipy et al. | 174/50 |
| 7,746,626 | B2 * | 6/2010 | Wang et al. | 361/679.16 |
| 7,825,334 | B2 * | 11/2010 | Chien | 174/50 |
| 7,885,055 | B2 * | 2/2011 | Park et al. | 361/679.01 |

* cited by examiner

*Primary Examiner* — Dhiru R Patel
(74) *Attorney, Agent, or Firm* — Steven M. Reiss

(57) ABSTRACT

A housing assembly includes a main body, a protecting cover, a connecting rod, a first elastic element, and a second elastic element. The main body has a receiving groove. At least one interface is mounted on a bottom surface of the receiving groove. The first elastic element provides a force for driving a portion of the protecting cover away from the main body. The second elastic element provides a force for driving the connecting rod to move in the direction of pressing the connecting rod.

12 Claims, 3 Drawing Sheets

HOUSING ASSEMBLY FOR ELECTRONIC DEVICE

BACKGROUND

1. Field of the Invention

The present invention relates to housing assemblies and, particularly to a housing assembly used for protecting an interface of an electronic device.

2. Description of Related Art

With the development of information technology, portable electronic devices, such as digital cameras, mp3 players, video cameras, mobile phones and personal digital assistants, are now in widespread use. Various kinds of connectors are necessarily required in the portable electronic device for, at least but not least, transmitting information to another portable electronic device, facilitating charging the portable electronic device from a power supply.

In some electronic devices, the connector is plugged into a housing in the electronic devices. One end of the connector has an outer electronic interface provided therein. The housing of the electronic device has an connecting interface defined in one sidewall thereof. An inner electronic interface is provided in the housing adjacent to the connecting interface. When the connector is in use, the end having the outer electronic interface is inserted into the connecting interface of the housing of the electronic device, thereby engaging the outer electronic interface with the inner electronic interface. This engagement enables the data or electric current to be transmitted between varying electronic devices. However, when no connector is connected to the electronic device, the inner electronic interface of the electronic device is liable to become contaminated by, e.g., dust entering through the interface, thus may affect the performance of the electronic device.

Therefore, a new housing assembly used for a portable electronic device is desired in order to overcome the above-described shortcomings.

BRIEF DESCRIPTION OF THE DRAWINGS

Many aspects of the present housing assembly and portable electronic device can be better understood with reference to the following drawings. These drawings are not necessarily drawn to scale, the emphasis instead being placed upon clearly illustrating the principles of the present housing assembly and portable electronic device. Moreover, in the drawings like reference numerals designate corresponding parts throughout the several views. Wherever possible, the same reference numbers are used throughout the drawings to refer to the same or like elements of an embodiment.

DETAILED DESCRIPTION OF THE EMBODIMENTS

Figure 1:
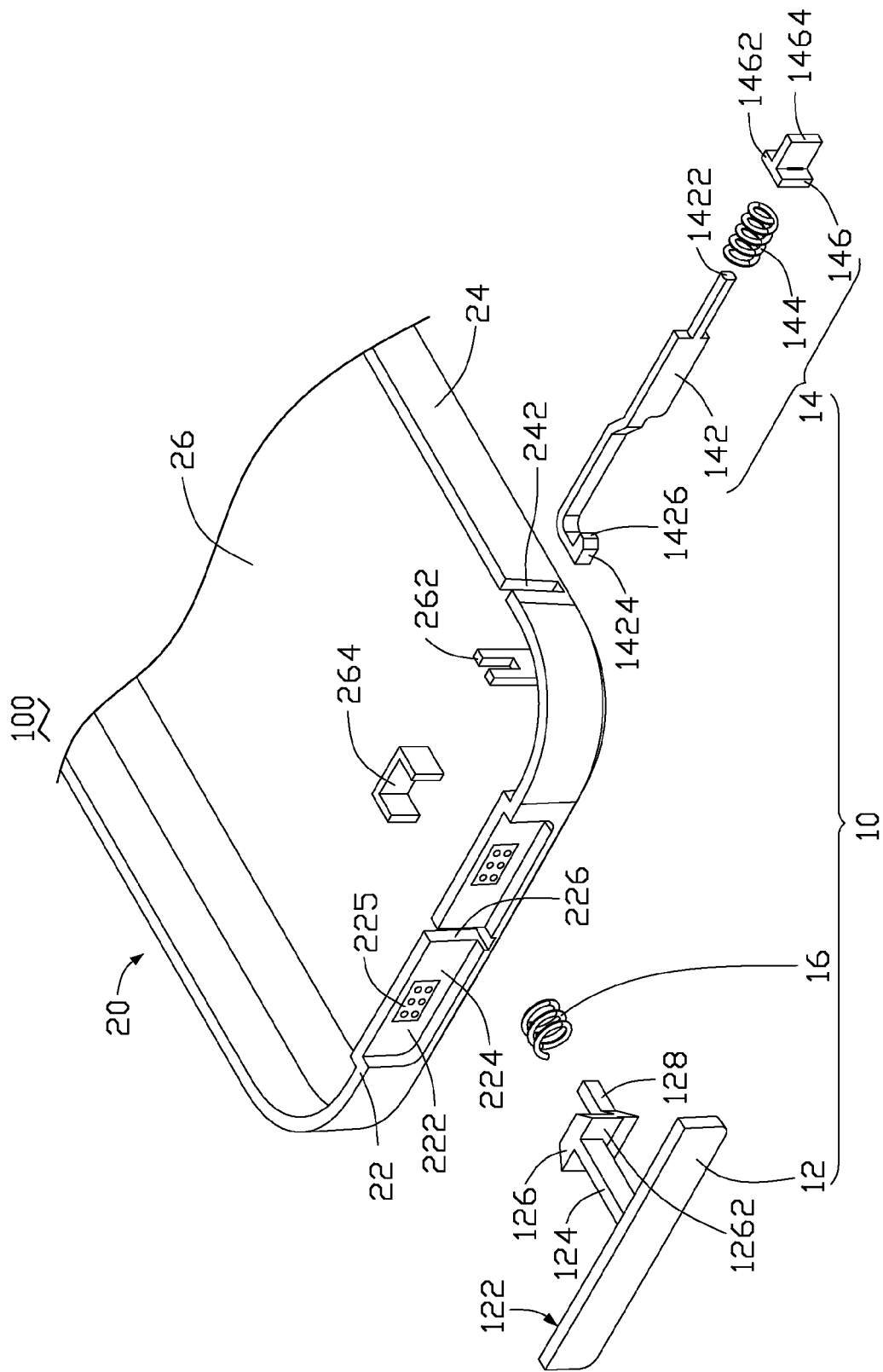
FIG. 1 is an exploded view of a housing assembly in accordance with an exemplary embodiment.
Figure 2:
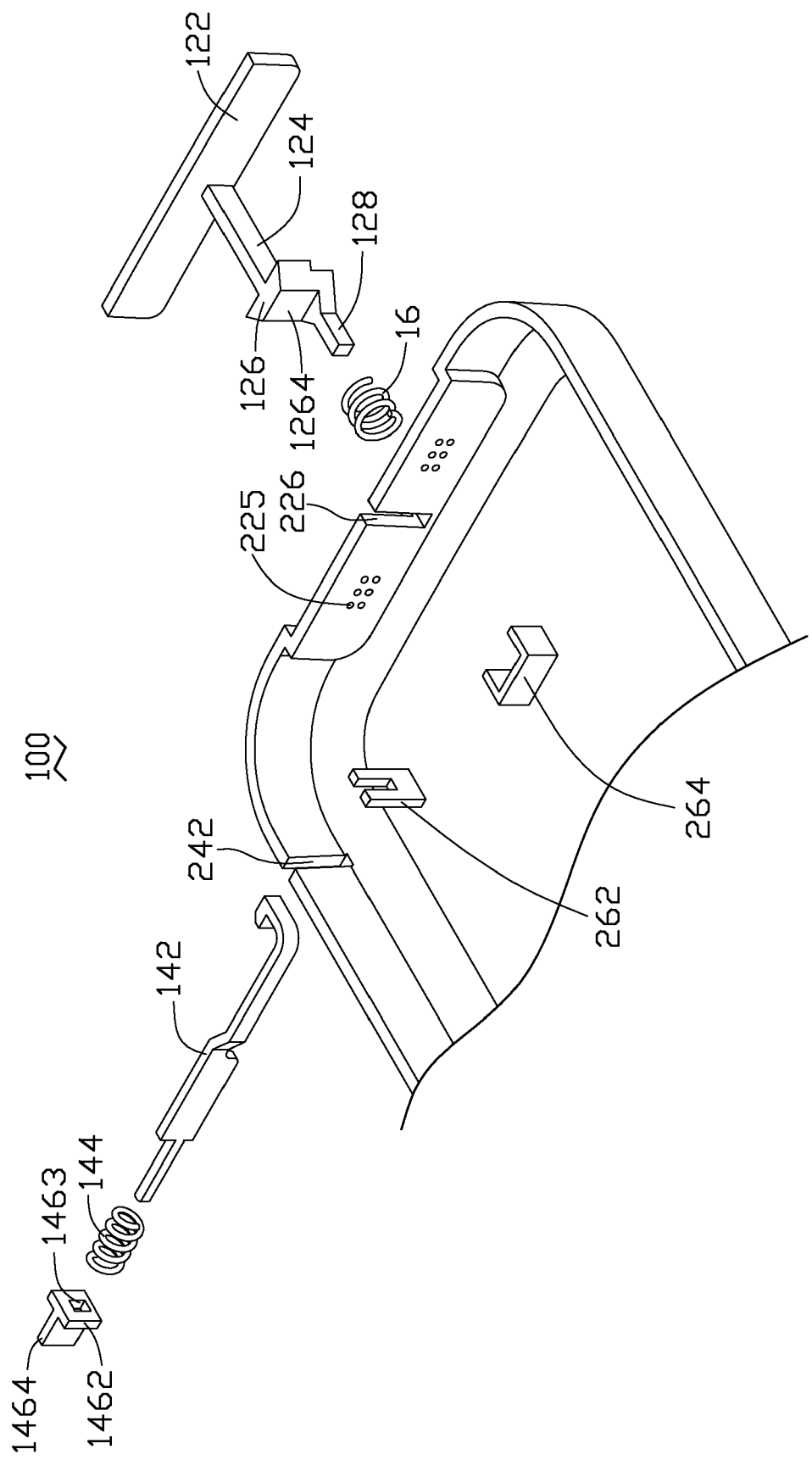
FIG. 2 is an isometric and exploded view of the housing assembly shown in FIG. 1, showing another aspect thereof.

Referring to FIGS. 1 and 2, the housing assembly 100 includes an interface protecting mechanism 10 and a main body 20. The interface protecting mechanism 10 can be mounted to the main body 20.

The interface protecting mechanism 10 includes a protecting cover 12, a button assembly 14, and a first elastic element 16.

The protecting cover 12 may be generally rectangular and includes a protecting surface 122 facing the main body 20 and at least one interface 225, a guiding pole 124 protruding from the protecting surface 122 and a securing portion 126 formed at the end of the guiding pole 124 opposite to the protecting surface 122. The securing portion 126 is configured (e.g., structured and/or arranged) for interacting with the button assembly 14 to secure the protecting surface 122 or allow the protecting surface 122 to move to a position that exposes the at least one interface 225. The securing portion 126 has one end 1262 larger than the other end 1264 thereof. The securing portion 126 may be a rectangular frustum. When assembled, the end 1262 is secured in position by a portion of the button assembly 14, and the other end 1264 resists against the first elastic element 16. The securing portion 126 has a post 128 protruding from the other end 1264. The post 128 is configured for receiving the first elastic element 16 thereof.

The button assembly 14 includes a connecting rod 142, a second elastic element 144, and a button cap 146.

The connecting rod 142 is generally hook-shaped. The connecting rod 142 has a first end 1422 and a second hook-shaped end 1424 or latching portion opposite to the first end 1422. The first end 1422 engages with the button cap 146, and the second end 1424 is for securing the securing portion 126 to retain the protecting mechanism 10 in a closed position. The button assembly 14 has a stopping portion 1426 protruding from the second end 1424. The stopping portion 1426 is configured for engaging to the securing portion 126.

The second elastic element 144 is a coil spring. One end of the second elastic element 144 resists against the main body 20 and the other end resists against the button cap 146.

The button cap 146 includes a mating portion 1462 and a pressing portion 1464 protruding from the mating portion 1462.

The mating portion 1462 is generally rectangular shaped and has one end that resists against the main body 20, the other end resists against the second elastic element 144. The mating portion 1462 defines a mating hole 1463 therein. The mating hole 1463 is configured for accommodating the connecting rod 142 therein.

The pressing portion 1464 may be generally rectangular shaped. The pressing portion 1464 extends from main body 20 and is configured for actuating the button assembly 14.

The first elastic element 16 is a coil spring and has one end resisting against the securing portion 126 and the other end resisting against the main body 20.

The main body 20 may be generally a rectangular case, which includes a first sidewall 22, a second sidewall 24, and a bottom wall 26. The first sidewall 22 is located adjacent to the second sidewall 24, both of which are mounted to the bottom wall 26.

The first sidewall 22 has a receiving recess 222 defined in an outer surface thereof. The receiving recess 222 has a substantially same shape and size as the protecting cover 12. The receiving recess 222 is configured for receiving the protecting cover 12 therein. An aperture 226 is defined in a bottom wall 224 of the receiving recess 222. The aperture 226 is configured for receiving the guiding pole 124 therein. The at least one interface 225 is disposed on the bottom wall 224 of the receiving recess 222. The at least one interface 225 may be a charging interface, such as an universal serial bus (USB) interface and so on.

The second sidewall 24 has a button slot 242 defined therethrough. The button slot 242 is configured for receiving the button cap 146 therein.

The bottom wall 26 has a U-shaped platform 262 and a resisting portion 264 protruding from the bottom wall 26. The platform 262 is configured for guiding the button assembly 14 therealong and resisting against the second elastic element 144. The resisting portion 264 is configured for resisting against the first elastic element 16.

Figure 3:
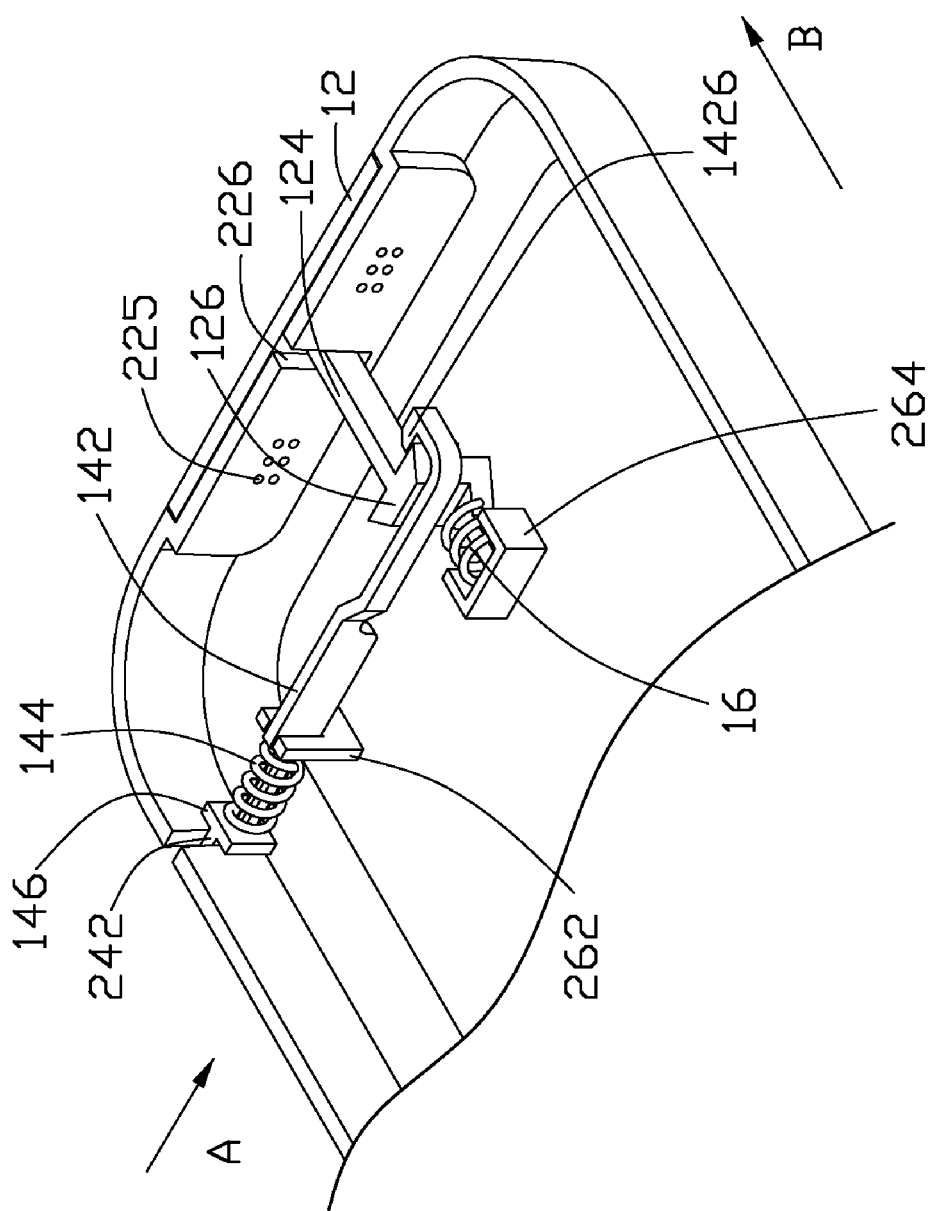
FIG. 3 is an assembled view of the housing assembly shown in FIG. 1.

Referring to FIG. 3, during assembly of the interface protecting mechanism 10 to the housing assembly 100, the first end 1422 of the connecting rod 142 passes through the second elastic element 144. The first end 1422 is inserted in the mating hole 1463 to join the connecting rod 142 with the button cap 146. The button cap 146 passes through the button hole 242, and the connecting rod 142 is disposed on the platform 262. During this stage, one end of the second elastic element 144 resists against the platform 262 and the other end resists against the button cap 146. The post 128 of the protecting cover 12 passes through the first elastic element 16, and the guiding pole 124 is disposed in the aperture 226. In this case, the securing portion 126 is secured to the stopping portion 1426 and the first elastic element 16 resists against the resisting portion 264 and the securing portion 126, thereby the protecting cover 12 is received in the receiving groove 222 and shields the at least one interface 225.

In use, the button cap 146 is pressed along the direction identified by an arrow A in FIG. 3. During such stage, the second elastic element 144 is compressed, and the stopping portion 1426 of the button assembly 14 moves along the arrow A. When the securing portion 126 is released from the stopping portion 1426, the button assembly 14 may be released. The accumulated force of the first elastic element 16 simultaneously drives the guiding post 128 to move along another direction identified by an arrow B in FIG. 3. Thus, the protecting cover 12 moves along the arrow B direction, and exposes the at least one interface 225.

One of the main advantages of the present embodiment is that the protecting cover 12 can open automatically and exposes the at least one interface 225 by pressing the button cap 146, thereby the housing assembly 100 can easily be operated.

It is to be understood, however, that even through numerous characteristics and advantages of the present embodiments have been set forth in the foregoing description, together with details of the structure and function of the embodiments, the disclosure is illustrative only, and changes may be made in detail, especially in matters of shape, size, and arrangement of parts within the principles of the embodiments to the full extent indicated by the broad general meaning of the terms in which the appended claims are expressed.

What is claimed is:

1. A housing assembly for use in a portable electronic device, comprising:
    a main body having a receiving recess defined therein, at least one interface being mounted on a bottom surface of the receiving recess, an aperture being defined in the bottom surface of the receiving recess, and the main body having a button slot defined therein;
    a protecting cover releasably mounted in the receiving recess for covering the at least one interface, the protecting cover having a guiding pole protruding therefrom, the guiding pole having a securing portion formed thereon, the guiding pole configured for entering into the main body through the aperture;
    a button assembly comprising a connecting rod having a stopping portion protruding from one end thereof and releasably latching with securing portion, and the other end thereof extending through the button slot;
    a first elastic element resisting the main body and the protecting cover, and providing an elastic force for driving the protecting cover away from the main body; and
    a second elastic element resisting the main body and the button assembly, and providing an elastic force for driving the connecting rod to move in the direction of pressing the connecting rod;
    wherein when the stopping portion is released from the securing portion, the first elastic element drives the protecting cover away from the main body so the protecting cover is out of the receiving recess.

2. The housing assembly as claimed in claim 1, wherein the main body has a resisting portion, and the first elastic element has g one end resisting against the resisting portion and the other end resisting against the securing portion.

3. The housing assembly as claimed in claim 2, wherein the securing portion has a first end larger than a second end thereof, the second end resisting against the first elastic element.

4. The housing assembly as claimed in claim 3, wherein the first end is secured by the stopping portion.

5. The housing assembly as claimed in claim 3, wherein the second end has a post protruding therefrom, the post receiving the first elastic element thereof.

6. The housing assembly as claimed in claim 1, wherein the main body has a guiding platform, the connecting rod being received on the guiding platform.

7. The housing assembly as claimed in claim 6, wherein the shape of the guiding platform is U-shaped.

8. The housing assembly as claimed in claim 6, further comprising a button cap secured on the end of the connecting rod.

9. The housing assembly as claimed in claim 8, wherein the second elastic element has one end resisting against the button cap and the other end resisting against the guiding platform.

10. The housing assembly as claimed in claim 8, wherein the button cap has a mating hole defined therein, the mating hole being configured for securing with the connecting rod.

11. The housing assembly as claimed in claim 1, wherein the stopping portion is hook-shaped.

12. A housing assembly for use in a portable electronic device, comprising:
    a main body having at least one interface being mounted on thereon;
    a protecting cover covering or exposing the at least one interface;
    a button assembly having a connecting rod and a latching portion releasably latched with the protecting cover, controlling movement of the protecting cover;
    a first elastic element resisting the main body and the protecting cover, and providing an elastic force driving the protecting cover away from the main body to exposing the at least one interface when the protecting cover being released from the button assembly; and
    a second elastic element resisting the main body and the button assembly, and providing an elastic force to securely latch the latching portion with the protecting cover, wherein when the button assembly is depressed to unlatch the protecting cover from the latching portion, the second elastic element urges the button assembly to an original position.

* * * * *